(12) United States Patent
Moschiano et al.

(10) Patent No.: US 9,543,000 B2
(45) Date of Patent: *Jan. 10, 2017

(54) DETERMINING SOFT DATA FOR COMBINATIONS OF MEMORY CELLS

(71) Applicant: Micron Technology, Inc., Boise, ID (US)

(72) Inventors: Violante Moschiano, Avezzano (IT); Tommaso Vali, Sezze (IT); Mark A. Hawes, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/973,362

(22) Filed: Dec. 17, 2015

(65) Prior Publication Data

US 2016/0104526 A1    Apr. 14, 2016

Related U.S. Application Data

(63) Continuation of application No. 14/259,405, filed on Apr. 23, 2014, now Pat. No. 9,230,661, which is a
(Continued)

(51) Int. Cl.
*G11C 11/34* (2006.01)
*G11C 11/56* (2006.01)
(Continued)

(52) U.S. Cl.
CPC ....... *G11C 11/5628* (2013.01); *G11C 16/0483* (2013.01); *G11C 16/10* (2013.01); *G11C 16/26* (2013.01)

(58) Field of Classification Search
CPC ... G11C 16/10; G11C 11/5628; G11C 11/5642
(Continued)

(56) References Cited

U.S. PATENT DOCUMENTS

| 7,251,158 B2 | 7/2007 | Hsia et al. |
| 7,596,023 B2 | 9/2009 | Magnavacca et al. |

(Continued)

FOREIGN PATENT DOCUMENTS

WO    2011113034    9/2011

OTHER PUBLICATIONS

International Search Report and Written Opinion for related PCT Application PCT/US2013/035969, mailed Jul. 29, 2013, (12 pgs).

*Primary Examiner* — Son Dinh
(74) *Attorney, Agent, or Firm* — Brooks, Cameron & Huebsch, PLLC

(57) ABSTRACT

The present disclosure includes apparatuses and methods for determining soft data for combinations of memory cells. A number of embodiments include an array of memory cells including a first and second memory cell each programmable to one of a number of program states, wherein a combination of the program states of the first and second memory cells corresponds to one of a number of data states, and a buffer and/or a controller coupled to the array and configured to determine soft data associated with the program states of the first and second memory cells and soft data associated with the data state that corresponds to the combination of the program states of the first and second memory cells based, at least in part, on the soft data associated with the program states of the first and second memory cells.

20 Claims, 5 Drawing Sheets

Related U.S. Application Data continuation of application No. 13/444,443, filed on Apr. 11, 2012, now Pat. No. 8,737,139.

(51) Int. Cl.
  *G11C 16/10* (2006.01)
  *G11C 16/04* (2006.01)
  *G11C 16/26* (2006.01)

(58) Field of Classification Search
  USPC .......................... 365/185.24, 185.18, 185.21
  See application file for complete search history.

(56) References Cited

U.S. PATENT DOCUMENTS

| | | | |
|---|---|---|---|
| 7,710,772 | B2 | 5/2010 | Magnavacca et al. |
| 8,149,618 | B2 | 4/2012 | Kang |
| 8,451,664 | B2 | 5/2013 | Radke et al. |
| 9,230,661 | B2 * | 1/2016 | Moschiano ............ G11C 16/10 |
| 2009/0106481 | A1 | 4/2009 | Yang et al. |
| 2009/0161742 | A1 | 6/2009 | Ivory et al. |
| 2011/0161597 | A1 | 6/2011 | Tremaine et al. |
| 2011/0235420 | A1 | 9/2011 | Sharon et al. |
| 2011/0246842 | A1 * | 10/2011 | Haratsch ............. G11C 11/5642 |
| | | | 714/722 |
| 2011/0258371 | A1 | 10/2011 | Yang et al. |
| 2011/0289376 | A1 | 11/2011 | Maccarrone et al. |
| 2011/0302475 | A1 | 12/2011 | Eisenhuth et al. |

\* cited by examiner

DETERMINING SOFT DATA FOR COMBINATIONS OF MEMORY CELLS

PRIORITY INFORMATION

This application is a Continuation of U.S. application Ser. No. 14/259,405, filed Apr. 23, 2014, which issues as U.S. Pat. No. 9,230,661 on Jan. 5, 2016, which is a Continuation of U.S. application Ser. No. 13/444,443, filed Apr. 11, 2012, which issued as U.S. Pat. No. 8,737,139 on May 27, 2014, the contents of which are included herein by reference.

TECHNICAL FIELD

The present disclosure relates generally to semiconductor memory and methods, and more particularly, to determining soft data for combinations of memory cells.

BACKGROUND

Memory devices are typically provided as internal, semiconductor, integrated circuits and/or external removable devices in computers or other electronic devices. There are many different types of memory including volatile and non-volatile memory. Volatile memory can require power to maintain its information and can include random-access memory (RAM), dynamic random access memory (DRAM), and synchronous dynamic random access memory (SDRAM), among others. Non-volatile memory can provide persistent information by retaining stored information when not powered and can include NAND flash memory, NOR flash memory, phase change random access memory (PCRAM), resistive random access memory (RRAM), and magnetic random access memory (MRAM), among others.

Memory devices can be combined together to form a solid state drive (SSD). An SSD can include non-volatile memory (e.g., NAND flash memory and/or NOR flash memory), and/or can include volatile memory (e.g., DRAM and/or SRAM), among various other types of non-volatile and volatile memory. Flash memory devices can include memory cells storing information in a charge storage structure such as a floating gate, for instance, and may be utilized as non-volatile memory for a wide range of electronic applications. Flash memory devices typically use a one-transistor memory cell that allows for high memory densities, high reliability, and low power consumption.

Memory cells in an array architecture can be programmed to a desired state. For instance, electric charge can be placed on or removed from the charge storage structure (e.g., floating gate) of a memory cell to program the cell to a particular program state. For example, a single level cell (SLC) can be programmed to two different program states, which can be represented by the binary units 1 or 0. Some flash memory cells can be programmed to more than two program states corresponding to particular data states (e.g., 1111, 0111, 0011, 1011, 1001, 0001, 0101, 1101, 1100, 0100, 0000, 1000, 1010, 0010, 0110, and 1110). Such cells may be referred to as multi state memory cells, multiunit cells, or multilevel cells (MLCs). MLCs can provide higher density memories without increasing the number of memory cells since each cell can represent more than one digit (e.g., more than one bit).

DETAILED DESCRIPTION

Figure 1:
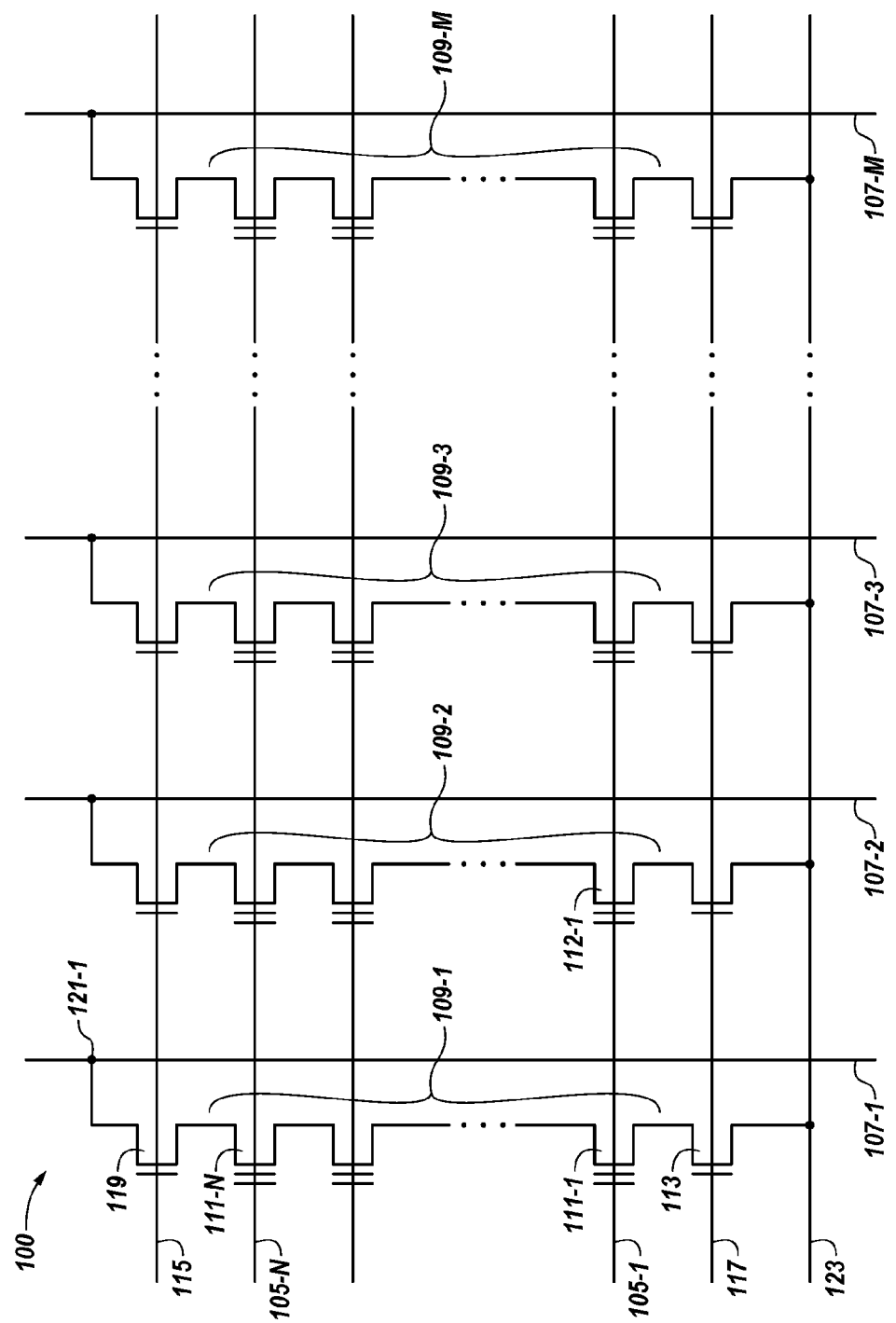
FIG. 1 illustrates a schematic diagram of a portion of a non-volatile memory array in accordance with a number of embodiments of the present disclosure.

The present disclosure includes apparatuses and methods for determining soft data for combinations of memory cells. A number of embodiments include an array of memory cells, wherein the array includes a first memory cell and a second memory cell, wherein the first and second memory cells are each programmable to one of a number of program states, and wherein a combination of the program states of the first and second memory cells corresponds to one of a number of data states. A number of embodiments also include a buffer and/or a controller coupled to the array and configured to determine soft data associated with the program states of the first and second memory cells and determine soft data associated with the data state that corresponds to the combination of the program states of the first and second memory cells based, at least in part, on the soft data associated with the program state of the first memory cell and the soft data associated with the program state of the second memory cell.

Hard data can refer to a binary data value stored in one or more memory cells and provided to a host as responsive to a read operation, for example. In various instances, soft data can also be determined in association with a read operation. For example, during a read operation, a ramped sensing signal can be applied to a selected memory cell, and a page buffer can latch a digital value corresponding to the amplitude of the sensing signal when the selected memory cell conducts (or stops conducting, in the case of a falling slope read operation). The most significant bit(s) of the digital value can correspond to the hard data (e.g., the program state of the selected cell), and the least significant bit(s) of the digital value can correspond to the associated soft data. Soft data can, for example, indicate the quality and/or confidence of the hard data (e.g., information regarding the probability of the cell storing the read hard data or of the cell storing different data). Accordingly, soft data can provide benefits such as increased accuracy and/or reliability (e.g., decreased error rate), and/or increased memory life, among other benefits.

In various instances, memory cells can store a fractional number of bits per cell, and data from multiple cells can be combined to provide an integer number of bits. In such instances, the soft data from one memory cell may not provide enough information about the quality of the hard data. Rather, the soft data from multiple memory cells may be needed to effectively evaluate the quality of the hard data. For example, the soft data from two 1½ bit cells may be needed to effectively evaluate the quality of the hard data stored in the two 1½ bit cells.

In the following detailed description of the present disclosure, reference is made to the accompanying drawings that form a part hereof, and in which is shown by way of illustration how a number of embodiments of the disclosure may be practiced. These embodiments are described in sufficient detail to enable those of ordinary skill in the art to practice the embodiments of this disclosure, and it is to be understood that other embodiments may be utilized and that process, electrical, and/or structural changes may be made without departing from the scope of the present disclosure.

As used herein, "a number of" something can refer to one or more such things. For example, a number of memory cells can refer to one or more memory cells. Additionally, the designators "M" and "N" as used herein, particularly with respect to reference numerals in the drawings, indicates that a number of the particular feature so designated can be included with a number of embodiments of the present disclosure.

The figures herein follow a numbering convention in which the first digit or digits correspond to the drawing figure number and the remaining digits identify an element or component in the drawing. Similar elements or components between different figures may be identified by the use of similar digits. For example, 100 may reference element "00" in FIG. 1, and a similar element may be referenced as 600 in FIG. 6. As will be appreciated, elements shown in the various embodiments herein can be added, exchanged, and/or eliminated so as to provide a number of additional embodiments of the present disclosure. In addition, as will be appreciated, the proportion and the relative scale of the elements provided in the figures are intended to illustrate the embodiments of the present disclosure, and should not be taken in a limiting sense.

FIG. 1 illustrates a schematic diagram of a portion of a non-volatile memory array 100 in accordance with a number of embodiments of the present disclosure. The embodiment of FIG. 1 illustrates a NAND architecture non-volatile memory array. However, embodiments described herein are not limited to this example. As shown in FIG. 1, memory array 100 includes access lines (e.g., word lines 105-1, . . . , 105-N) and intersecting data lines (e.g., local bit lines) 107-1, 107-2, 107-3, . . . , 107-M. For ease of addressing in the digital environment, the number of word lines 105-1, . . . , 105-N and the number of local bit lines 107-1, 107-2, 107-3, . . . , 107-M can be some power of two, e.g., 256 word lines by 4,096 bit lines.

Memory array 100 includes NAND strings 109-1, 109-2, 109-3, . . . , 109-M. Each NAND string includes non-volatile memory cells 111-1, . . . , 111-N, each communicatively coupled to a respective word line 105-1, . . . , 105-N. Each NAND string (and its constituent memory cells) is also associated with a local bit line 107-1, 107-2, 107-3, . . . , 107-M. The non-volatile memory cells 111-1, . . . , 111-N of each NAND string 109-1, 109-2, 109-3, . . . , 109-M are connected in series source to drain between a source select gate (SGS) (e.g., a field-effect transistor (FET)) 113, and a drain select gate (SGD) (e.g., FET) 119. Each source select gate 113 is configured to selectively couple a respective NAND string to a common source 123 responsive to a signal on source select line 117, while each drain select gate 119 is configured to selectively couple a respective NAND string to a respective bit line responsive to a signal on drain select line 115.

As shown in the embodiment illustrated in FIG. 1, a source of source select gate 113 is connected to a common source line 123. The drain of source select gate 113 is connected to the source of the memory cell 111-1 of the corresponding NAND string 109-1. The drain of drain select gate 119 is connected to bit line 107-1 of the corresponding NAND string 109-1 at drain contact 121-1. The source of drain select gate 119 is connected to the drain of the last memory cell 111-N (e.g., a floating-gate transistor) of the corresponding NAND string 109-1.

In a number of embodiments, construction of non-volatile memory cells 111-1, . . . , 111-N includes a source, a drain, a charge storage structure such as a floating gate, and a control gate. Non-volatile memory cells 111-1, . . . , 111-N have their control gates coupled to a word line, 105-1, . . . , 105-N respectively. A "column" of the non-volatile memory cells, 111-1, . . . , 111-N, make up the NAND strings 109-1, 109-2, 109-3, . . . , 109-M, and are coupled to a given local bit line 107-1, 107-2, 107-3, . . . , 107-M, respectively. A "row" of the non-volatile memory cells are those memory cells commonly coupled to a given word line 105-1, . . . , 105-N. The use of the terms "column" and "row" is not meant to imply a particular linear (e.g., vertical and/or horizontal) orientation of the non-volatile memory cells. A NOR array architecture would be similarly laid out, except that the string of memory cells would be coupled in parallel between the select gates.

As one of ordinary skill in the art will appreciate, subsets of cells coupled to a selected word line (e.g., 105-1, . . . , 105-N) can be programmed and/or sensed (e.g., read) together as a page of memory cells. A programming operation (e.g., a write operation) can include applying a number of program pulses (e.g., 16V-20V) to a selected word line in order to increase the threshold voltage (Vt) of selected cells coupled to that selected access line to a desired program voltage level corresponding to a target (e.g., desired) program state.

A sense operation, such as a read or program verify operation, can include sensing a voltage and/or current change of a bit line coupled to a selected cell in order to determine the program state of the selected cell, as well as the soft data associated therewith. The sensing operation can involve providing a voltage to (e.g., biasing) a bit line (e.g., bit line 107-1) associated with a selected memory cell above a voltage (e.g., bias voltage) provided to a source line (e.g., source line 123) associated with the selected memory cell. A sensing operation could alternatively include precharging the bit line followed with discharge when a selected cell begins to conduct, and sensing the discharge.

Sensing the state of a selected cell can include providing a number of ramped sensing signals (e.g., read voltages) to a selected word line while providing a number of pass signals (e.g., read pass voltages) to the word lines coupled to the unselected cells of the string sufficient to place the unselected cells in a conducting state independent of the Vt of the unselected cells. The bit line corresponding to the selected cell being read and/or verified can be sensed to determine whether or not the selected cell conducts in response to the particular sensing voltage applied to the selected word line. For example, the program state and/or associated soft data of a selected cell can be determined by the word line voltage at which the bit line current reaches a particular reference current associated with a particular state.

As one of ordinary skill in the art will appreciate, in a sensing operation performed on a selected memory cell in a NAND string, the unselected memory cells of the string are biased so as to be in a conducting state. In such a sensing operation, the program state and/or associated soft data of the selected cell can be determined based on the current and/or voltage sensed on the bit line corresponding to the string. For instance, the program state and/or associated soft data of the selected cell can be determined based on whether the bit line current changes by a particular amount or reaches a particular level in a given time period.

When the selected cell is in a conductive state, current flows between the source line contact at one end of the string and a bit line contact at the other end of the string. As such, the current associated with sensing the selected cell is carried through each of the other cells in the string, the diffused regions between cell stacks, and the select transistors.

In a number of embodiments of the present disclosure, a memory cell can be programmed to one of a number of program states corresponding to either an integer or non-integer (e.g., fractional) number of bits. For example, a cell could store 1½ bits by being programmed to one of three program states, as described in more detail herein. In order to output an integer number of bits, data from an even number of (e.g., two) cells storing 1½ bits could be combined by logic in a controller (e.g., a fractional bit controller). For example, in the embodiment illustrated in FIG. 1, data from cells 111-1 and 112-1, each storing a number of bits with a ½ fractional remainder, (e.g., 1½ bits), which are coupled to data lines 107-1 and 107-2, could be combined by logic in a controller to output an integer number of bits (e.g., three bits).

Figure 2:
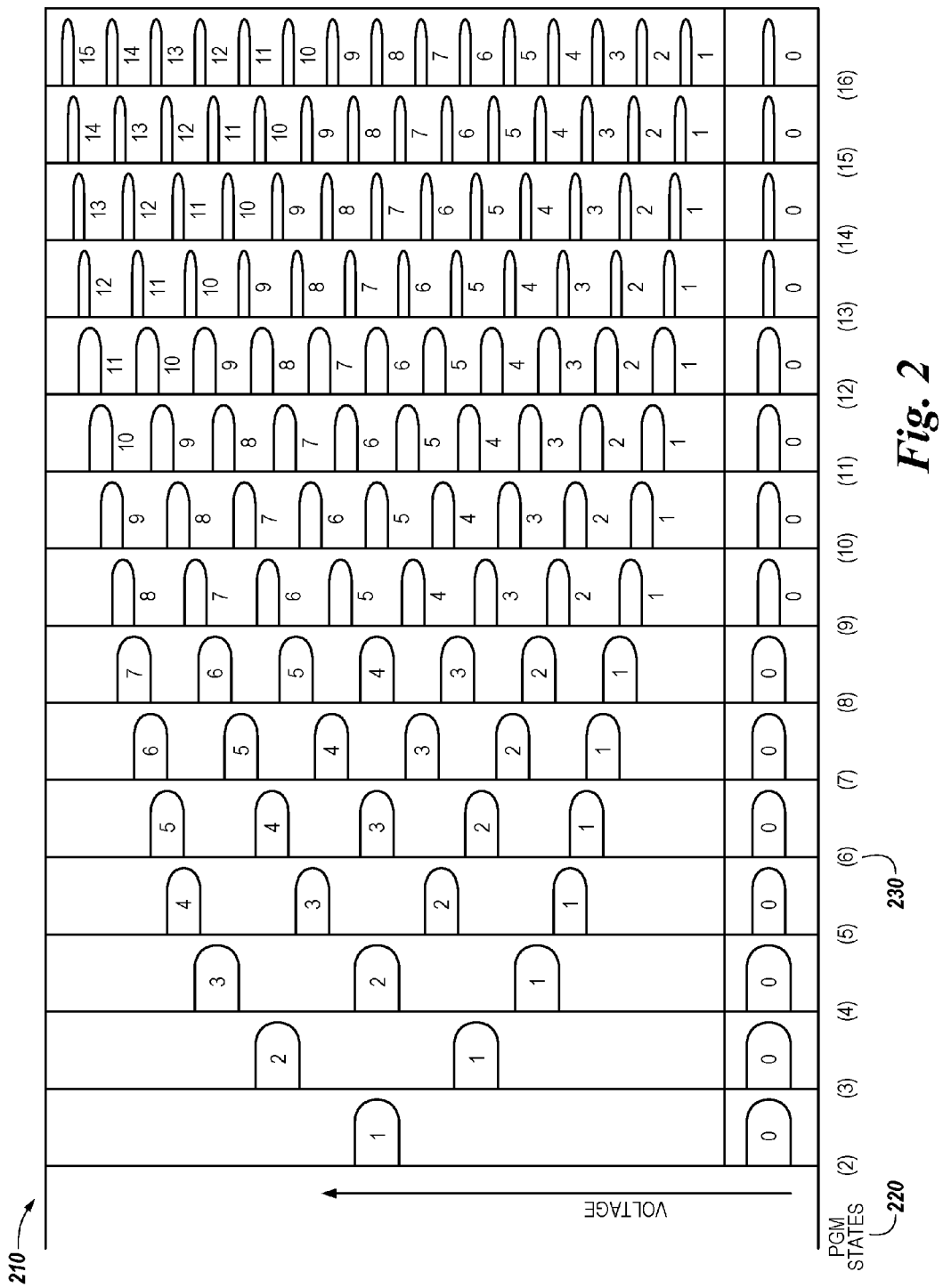
FIG. 2 is a diagram illustrating examples of different numbers of program states to which memory cells can be programmed in accordance with a number of embodiments of the present disclosure.

FIG. 2 is a diagram 210 illustrating examples of different numbers of program states to which memory cells can be programmed in accordance with a number of embodiments of the present disclosure. The memory cells can be NAND flash memory cells as described above and can be programmed to various Vt levels within a voltage range of about −2V to +3V; however, embodiments are not limited to a particular type of memory cell or to a particular operational voltage range.

Row 220 indicates the quantity of program states to which the memory cell may be programmed. The program states shown in FIG. 2 are labeled 0, 1, 2, etc., with each program states representing a distribution of Vt levels corresponding to the respective program states. In a number of embodiments, the program state 0 can be a lowermost program state (e.g., a program state corresponding to lowermost Vt levels) and may be referred to as an erase state since cells can be in a lowermost state after an erase operation; however, embodiments are not so limited.

The number of units (e.g., bits) of data that can be stored by a memory cell can be determined using the formula $\log_2(L)$, where L is the number of program states to which the cell is programmable. For example, a memory cell that can be programmed to one of two different program states 0 or 1 can store one unit (e.g., bit) of data. A memory cell that can be programmed to one of three different program states 0, 1, or 2 can store 1½ units of data. A memory cell that can be programmed to one of four different program states 0, 1, 2, or 3 can store 2 units of data. A memory cell that can be programmed to one of five different program states 0 to 4 can store 2¼ units of data. A memory cell that can be programmed to one of six different program states 0 to 5 (e.g., a memory cell corresponding to column 230) can store 2½ units of data. A memory cell that can be programmed to one of seven different program states 0 to 6 can store 2¾ units of data. A memory cell that can be programmed to one of eight different program states 0 to 7 can store 3 units of data. A memory cell that can be programmed to one of nine different program states 0 to 8 can store 3⅛ units of data, etc.

Memory cells programmable to a power of 2 quantity of program states (e.g., 2 program states, 4 program states, 8 program states, 16 program states, etc.) can individually store an integer number of bits per cell (e.g., $\log_2(L)$ bits/cell where L is the number of program states to which the cell is programmable). As such, the program state of each memory cell can correspond to (e.g., be directly mapped to) one of L different data states, such as those represented by N bit data patterns where N is the integer quantity of bits stored in the cell. For instance, the program states of a cell programmable to two program states (0 and 1) can be mapped to 0 or 1 (e.g., a 1 bit data pattern), the program states of a cell programmable to 4 program states (0 to 3) can be mapped to 00, 01, 10, and 11, respectively (e.g., a 2 bit data pattern), and the program states of a cell programmable to 8 program states (0 to 7) can be mapped to 000, 001, 010, 011, 100, 101, 110, and 111, respectively (e.g., a 3 bit data pattern).

In contrast, memory cells programmable to a non-power of 2 quantity of program states individually store a fractional (e.g., non-integer) number of bits per cell. As such, rather than program states of each individual cell mapping to an N bit data pattern, combinations of the L program states to which each individual cell of a group of cells is programmable are mapped to an N bit data pattern where N is an integer quantity of bits stored in the group. For instance, combinations of respective program states of a group of two memory cells programmable to three program states (0, 1, and 2) (e.g., 1½ bits/cell) are mapped to a 3 bit (e.g., 1½ bits/cell×2 cells) data pattern (e.g., 000, 110, 100, etc.). Similarly, combinations of respective program states of a group of four memory cells programmable to five program states (0 to 4) (e.g., 2¼ bits/cell) are mapped to a 9 bit (e.g., 2¼ bits/cell×4 cells) data pattern (e.g., 110011001, 000001111, 101010101, etc.), and combinations of respective program states of a group of eight memory cells programmable to 9 states (0 to 8) (e.g., 3⅛ bits/cell) are mapped to a 25 bit (e.g., 3⅛ bits/cell×8 cells) data pattern (e.g., 0000011111000001111100000, 1010101010101010101010101, 1111111111111111110000000, etc.).

In general, for a group of cells collectively storing an integer number (N) of units of data (e.g., bits), but individually storing a fractional number of units of data, $2^N$ different N unit data patterns are mapped to a corresponding number (e.g., $2^N$) of different program state combinations of the group. As an example, consider a group of two cells each programmed to one of three program states (0, 1, or 2) such that the group collectively stores 3 bits of data (e.g., 1½ bits/cell). As such, $2^3$ (e.g., 8) different 3 bit data patterns are mapped to $2^3$ (e.g., 8) different program state combinations of the group.

In a number of embodiments, a constellation (e.g., an L×L square constellation where L is the quantity of program states to which a cell is programmable) can be used to represent the different possible program state combinations associated with a group of fractional unit memory cells. For instance, each possible program state combination can correspond to a different constellation point, which can be mapped to a particular N unit data pattern, where N is the integer quantity of data units stored in the group of cells. The quantity of program state combinations (e.g., the quantity of constellation points) can equal $L^2$, which can be greater than the $2^N$ different N unit data patterns corresponding to the N quantity of data units stored in the group of cells. As such, one or more of the $L^2$ program state combinations may not be mapped to an N unit data pattern, or one or more of the $L^2$ program state combinations may be mapped to a same one of the N unit data patterns as one or more others of the $L^2$ program state combinations. An example of a mapping constellation in accordance with a number of embodiments of the present disclosure is described below in connection with FIG. 3.

Figure 3:
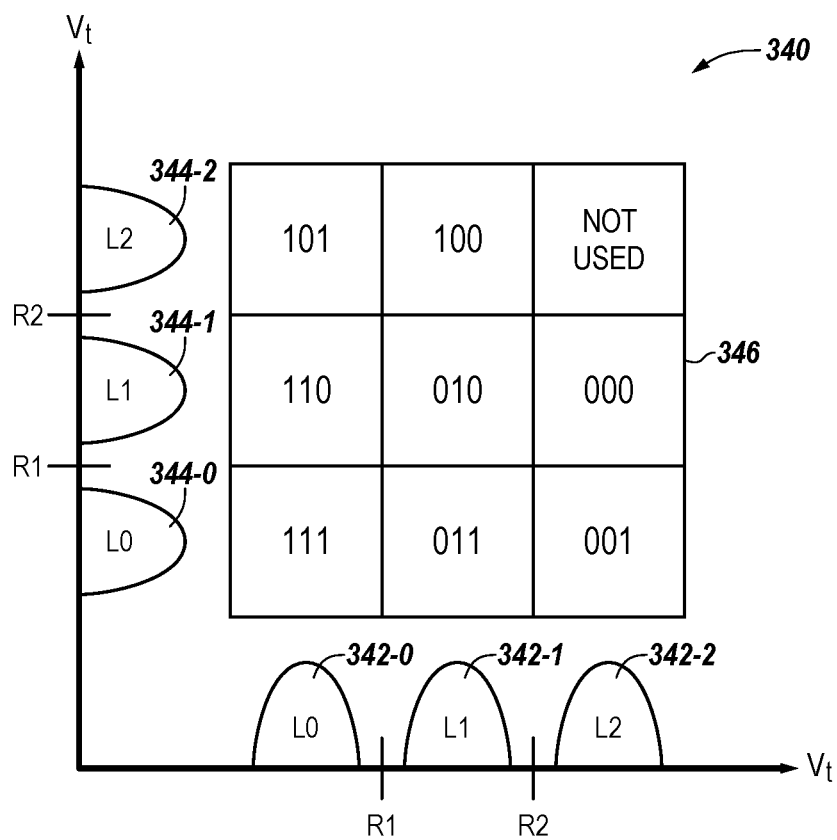
FIG. 3 illustrates a diagram of a number of program states and data states corresponding to combinations of program states in accordance with a number of embodiments of the present disclosure.

FIG. 3 illustrates a diagram 340 of a number of program states and data states (e.g., binary values) corresponding to combinations of program states in accordance with a number of embodiments of the present disclosure. The example shown in FIG. 3 can represent, for example, memory cells 111-1, . . . , 111-N previously described in connection with FIG. 1. The example shown in FIG. 3 represents two 1½ bit (e.g., three-state) memory cells. However, embodiments of the present disclosure are not limited to this example of 1½ bit memory cells, and can include various other fractional bit memory cells (e.g., 2¼ bit, 3⅛ bit, etc.).

In the example illustrated in FIG. 3, the three program states 342-0 (L0), 342-1 (L1), and 342-2 (L2) to which a first of the two 1½ bit memory cells can be programmed are shown on the x-axis of diagram 340, and the three program states 344-0 (L0), 344-1 (L1), and 344-2 (L2) to which a second (e.g., the other) of the two 1½ bit memory cells can be programmed are shown on the y-axis of diagram 340. The first memory cell can be a part of a first page (e.g., a first physical page) of memory cells, and the second memory cell can be a part of a second page (e.g., a second physical page) of memory cells. The first page can be, for example, an even page, and the second page can be, for example, an odd page, or vice versa. In this example, the program states of the first and second pages of cells combined (e.g., encoded to) store three logical pages of data. Further, in the example illustrated in FIG. 3, program states 342-2 and 344-2 can be referred to as uppermost program states since the Vt levels corresponding to those program states have the largest magnitude.

A number of read voltages (e.g., R1 and R2) are illustrated in FIG. 3. Read voltages R1 and R2 can be used to distinguish between program states L0, L1, and L2 during a read operation. In a read operation performed on a selected memory cell in a NAND string, the unselected memory cells of the string can be biased with a pass voltage so as to be in a conducting state. When all cells in a string are in a conductive state, current can flow between the source line contact at one end of the string and a drain line contact at the other end of the string. As such, the program state of the selected cell can be determined based on the current and/or voltage sensed on a bit line corresponding to a particular string when the selected cell begins to conduct (e.g., in response to the particular read voltage applied to the control gate of the cell (via a selected word line)). For example, the program state of the selected cell can be determined based on whether the bit line current changes by a particular amount, or reaches a particular level within a given time period. Other types of read operations are also possible, as will be understood by one of ordinary skill in the art.

The combined program states of the first memory cell and the second memory cell corresponds to one of a number of (e.g., eight) data states (e.g., hard data). Chart 346 shown in FIG. 3 illustrates the different possible program state combinations for the first and second memory cells, and the eight data states that correspond to the different combinations.

For example, in the embodiment illustrated in FIG. 3, the combination of the first program state (e.g., L0) for the first memory cell and the first program state (e.g., L0) for the second memory cell corresponds to the data state 111 (e.g., a hard data value of 111 can be output responsive to a read request). The combination of the first program state for the first memory cell and the second program state (e.g., L1) for the second memory cell corresponds to the data state 110, the combination of the first program state for the first memory cell and the third program state (e.g., L2) for the second memory cell corresponds to the data state 101, the combination of the second program state (e.g., L1) for the first memory cell and the first program state for the second memory cell corresponds to the data state 011, the combination of the second program state for the first memory cell and the second program state for the second memory cell corresponds to the data state 010, the combination of the second program state for the first memory cell and the third program state for the second memory cell corresponds to the data state 100, the combination of the third program state (e.g., L2) for the first memory cell and the first program state for the second memory cell corresponds to the data state 001, and the combination of the third program state for the first memory cell and the second program state for the second memory cell corresponds to the data state 000. The combination of the third program state for the first memory cell and the third program state for the second memory cell does not correspond to a data state, as illustrated in FIG. 3. However, embodiments are not limited to the data state assignments illustrated in FIG. 3.

Figure 4:
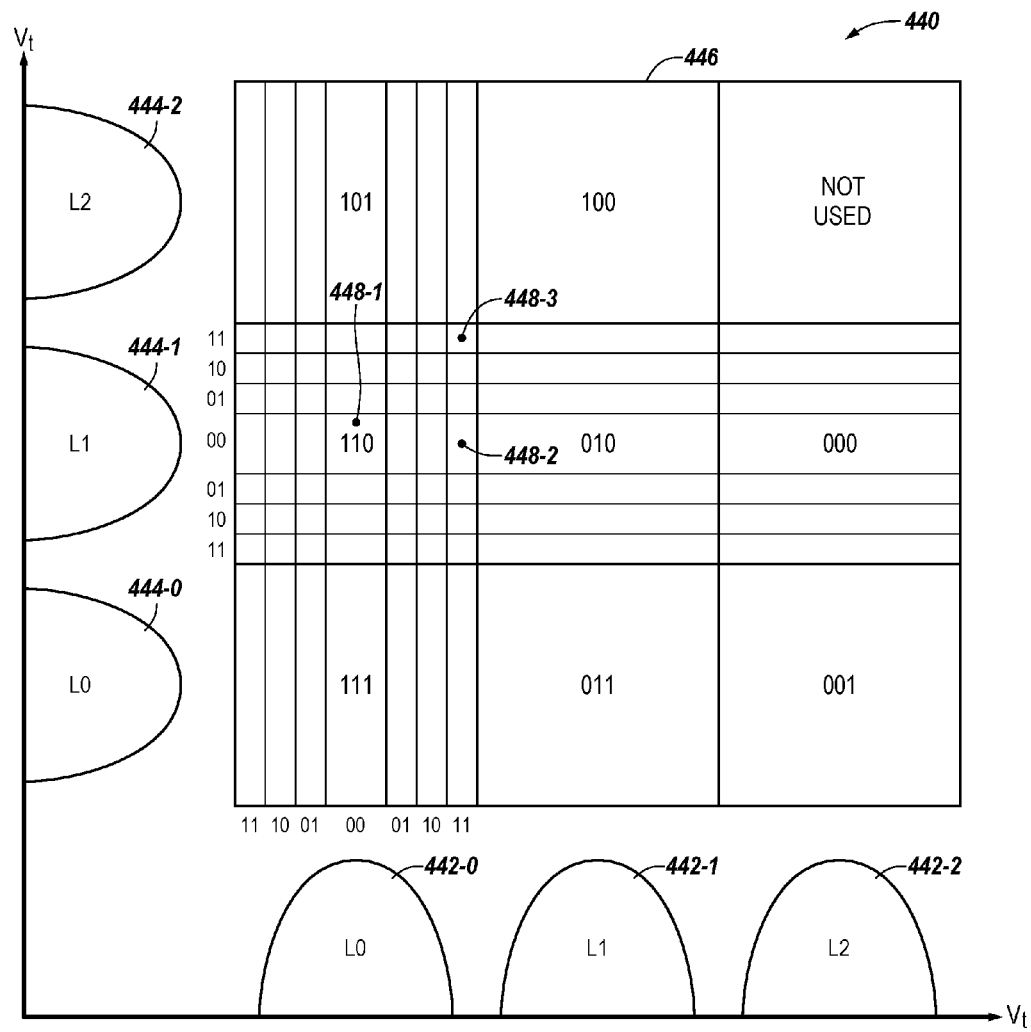
FIG. 4 illustrates a diagram associated with determining soft data in accordance with a number of embodiments of the present disclosure.

FIG. 4 illustrates a diagram 446 associated with determining soft data in accordance with a number of embodiments of the present disclosure. The example shown in FIG. 4 represents two 1½ bit (e.g., three-state) memory cells in a manner analogous to that previously described in connection with FIG. 3. For example, program states 442-0, 442-1, 442-2, 444-0, 444-1, and 444-2 illustrated in FIG. 4 can be analogous to program states 342-0, 342-1, 342-2, 344-0, 344-1, and 344-2, respectively, previously described in connection with FIG. 3. Further, chart 446 shown in FIG. 4 illustrates the different possible program state combinations for the two memory cells in a manner analogous to chart 346 previously described in connection with FIG. 3. That is, the combined program states of the two memory cells can correspond to one of a number of data states in a manner analogous to that previously described in connection with FIG. 3.

Each program state (e.g., L0, L1, and L2) of the two memory cells can have soft data associated therewith. For simplicity and so as not to obscure embodiments of the present disclosure, only the soft data associated with program state 442-0 (L0) of the first of the two memory cells and the soft data associated with program state 444-1 (L1) of the second of the two memory cells is shown in the example illustrated in FIG. 4. However, the other two program states of the first and second memory cells can also have soft data associated therewith in an analogous manner.

In a number of embodiments, different Vt distributions associated with program states can have soft data (e.g., bits) assigned thereto. As previously described herein, the soft data can correspond to the least significant bit(s) of a digital value that corresponds to the amplitude of a ramped sensing signal applied to a selected memory cell when the cell conducts (or stops conducting, in the case of a falling slope read operation). In this example, two bits are used to provide soft data (e.g., quality and/or confidence information) associated with the program states.

As an example, in the embodiment illustrated in FIG. 4, point 448-1 represents a situation in which soft data 00 is associated with the program states of both the first and second memory cells. As an additional example, point 448-2 represents a situation in which soft data 11 is associated with program state 442-0 (L0) of the first memory cell and soft data 00 is associated with program state 444-1 (L1) of the second memory cell. As an additional example, point 448-3 represents a situation in which soft data 11 is associated with the program states of both the first and second memory cells. However, embodiments of the present disclosure are not limited to these examples.

Soft data associated with a program state of a memory cell can indicate a location of the Vt associated with the memory cell within the Vt distribution associated with the program state of the memory cell. For example, in the embodiment illustrated in FIG. 4, if the program state of the first memory cell is 442-0 (L0) and the program state of the second memory cell is 444-1 (L1), the soft data associated with the program state of the first memory cell (e.g., 442-0) can indicate a location of the Vt associated with the first memory cell within the Vt distribution associated with program state 442-0, and the soft data associated with the program state of the second memory cell (e.g., 444-1) can indicate a location of the Vt associated with the second memory cell within the Vt distribution associated with program state 444-1.

For example, in the embodiment illustrated in FIG. 4, soft data 11 indicates that the Vt associated with the memory cell is located toward (e.g., near or at) the edge of the Vt distribution associated with the program state of the memory cell (e.g., the Vt associated with the first memory cell is located toward the edge of the Vt distribution associated with program state 442-0 and the Vt associated with the second memory cell is located toward the edge of the Vt distribution associated with program state 444-1). That is, soft data 11 can indicate a low hard data quality and/or confidence. Soft data 10 indicates that the Vt associated with the memory cell is located further from the edge (e.g., closer to the center) of the Vt distribution associated with the program state of the memory cell than soft data 11 (e.g., the Vt associated with the first memory cell is located further from the edge of the Vt distribution associated with program state 442-0 than soft data 11 and the Vt associated with the second memory cell is located further from the edge of the Vt distribution associated with program state 444-1 than soft data 11). Soft data 01 indicates that the Vt associated with the memory cell is located further from the edge (e.g., closer to the center) of the Vt distribution associated with the program state of the memory cell than soft data 10 (e.g., the Vt associated with the first memory cell is located further from the edge of the Vt distribution associated with program state 442-0 than soft data 10 and the Vt associated with the second memory cell is located further from the edge of the Vt distribution associated with program state 444-1 than soft data 10). Soft data 00 indicates that the Vt associated with the memory cell is located toward (e.g., near or at) the center of the Vt distribution associated with the program state of the memory cell (e.g., the Vt associated with the first memory cell is located toward the center of the Vt distribution associated with program state 442-0 and the Vt associated with the second memory cell is located toward the center of the Vt distribution associated with program state 444-1). That is, soft data 00 can indicate a high hard data quality and/or confidence.

Soft data associated with a program state of a memory cell can also indicate a probability of whether the Vt associated with the memory cell corresponds to the program state of the memory cell. For example, in the embodiment illustrated in FIG. 4, if the program state of the first memory cell is 442-0 (L0) and the program state of the second memory cell is 444-1(L1), the soft data associated with the program state of the first memory cell (e.g., 442-0) can indicate a probability of whether the Vt associated with the first memory cell corresponds to program state 442-0, and the soft data associated with the program state of the second memory cell (e.g., 444-1) can indicate a probability of whether the Vt associated with the second memory cell corresponds to program state 444-1.

For example, in the embodiment illustrated in FIG. 4, soft data 11 indicates a low probability that the Vt associated with the memory cell corresponds to the program state of the memory cell (e.g., a low probability that the Vt associated with the first memory cell corresponds to program state 442-0 and a low probability that the Vt associated with the second memory cell corresponds to program state 444-1). Soft data 10 and 01 indicate a medium probability (e.g., a probability that is greater than the low probability) that the Vt associated with the memory cell corresponds to the program state of the memory cell (e.g., a medium probability that the Vt associated with the first memory cell corresponds to program state 442-0 and a medium probability that the Vt associated with the second memory cell corresponds to program state 444-1). Soft data 00 indicates a high probability (e.g., a probability that is greater than the medium probability) that the Vt associated with the memory cell corresponds to the program state of the memory cell (e.g., a high probability that the Vt associated with the first memory cell corresponds to program state 442-0 and a high probability that the Vt associated with the second memory cell corresponds to program state 444-1).

Embodiments of the present disclosure are not limited to the soft data assignments (e.g., soft data regions) shown in FIG. 4. For example, a greater quantity of soft data regions can be used to indicate a more precise Vt location within a Vt distribution and/or a more precise probability of whether a Vt corresponds to a program state. However, for simplicity and so as not to obscure embodiments of the present disclosure, four soft data values representing four different hard data quality and/or confidence levels have been illustrated in FIG. 4. That is, embodiments of the present disclosure are not limited to two soft data bits.

The soft data associated with the program states of the two memory cells can be determined, for example, by performing a read operation on the memory cells. In a number of embodiments, the read operation can also determine the program states of the two memory cells. That is, the program states of the two memory cells and the soft data associated with the program states of the two memory cells can both be determined by the same read operation. Performing the read operation can include, for example, executing a read command on the two memory cells. The read command can include a first command to read the first memory cell, and a second command to read the second memory cell.

The soft data associated with the program states of the two memory cells can be used to determine soft data associated with the data state (e.g., hard data) that corresponds to the combination of the program states of the two memory cells (e.g., 110). For example, the soft data associated with the program state of the first memory cell (e.g., 442-0) can be combined with the soft data associated with the program state of the second memory cell (e.g., 444-1), and the soft data associated with the data state that corresponds to the combination of the program states of the two memory cells can be determined based on the combination of the soft data associated with the program states of the first and second memory cells. That is, the soft data associated with the data state that corresponds to the combination of the program states of the two memory cells can be determined by combining the soft data associated with the program state of the first memory cell and the soft data associated with the program state of the second memory cell. The combination of the soft data associated with the program states of the two memory cells (e.g., the soft data associated with the data state that corresponds to the combination of the program states of the two memory cells) can be, for example, one of a number of soft data combinations, as will be further described herein (e.g., in connection with FIG. 5).

Because the soft data associated with the data state that corresponds to the combination of the program states of the two memory cells can be a combination of the soft data associated with the program states of the two memory cells, the soft data associated with the data state that corresponds to the combination of the program states of the two memory cells can indicate the location of the Vts associated with the two memory cells within the Vt distributions associated with the program states of the two memory cells (e.g., 442-0 and 444-1). Further, the soft data associated with the data state that corresponds to the combination of the program states of the two memory cells can indicate the probability of whether the Vts associated with the two memory cells correspond to the program states of the two memory cells. For example, the soft data associated with the data state that corresponds to the combination of the program states of the two memory cells can indicate a very low, low, medium, or high probability of whether the Vts associated with the two memory cells correspond to the program states of the two memory cells, as will be further described herein (e.g., in connection with FIG. 5).

Figure 5:
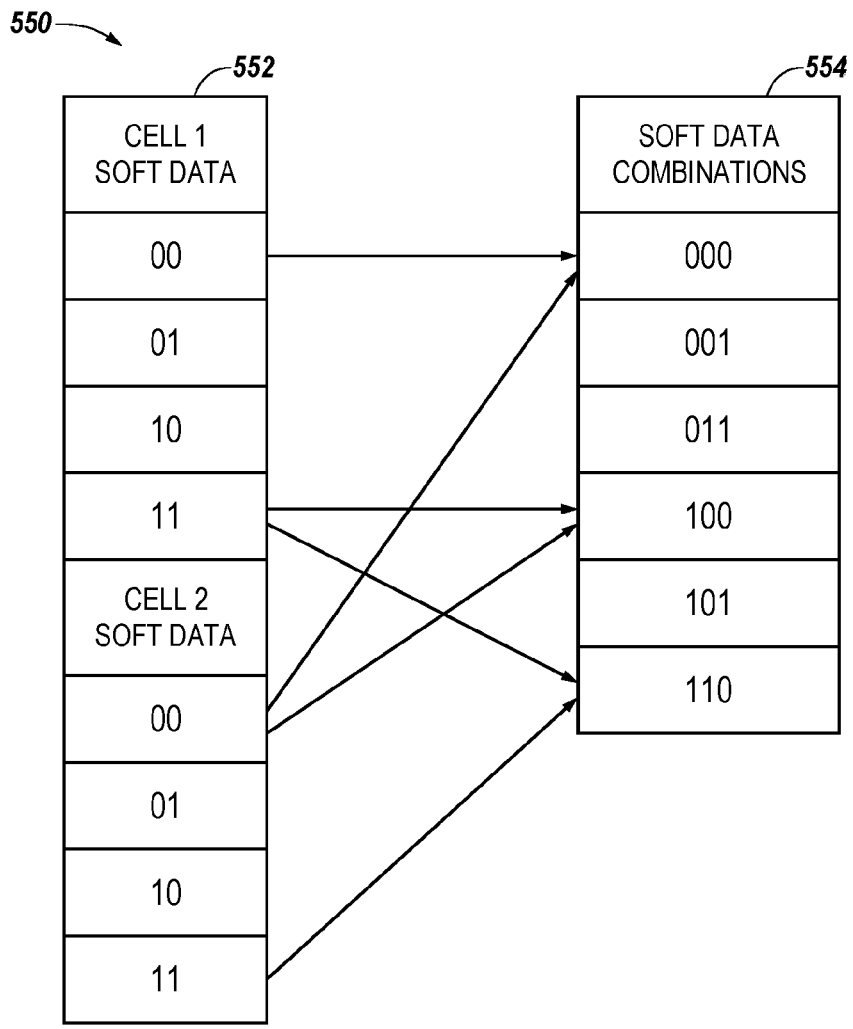
FIG. 5 is a chart illustrating combinations of soft data from a number of memory cells in accordance with a number of embodiments of the present disclosure.

FIG. 5 is a chart 550 illustrating combinations of soft data from a number of memory cells in accordance with a number of embodiments of the present disclosure. Column 552 of chart 550 includes soft data associated with the program states of two memory cells. The soft data and the program states of the two memory cells can be analogous to that previously described herein in connection with FIG. 4. That is, the cell 1 soft data in column 552 can be analogous to the soft data associated with the program state (e.g., 442-0) of the first of the two memory cells previously described in connection with FIG. 4, and the cell 2 soft data in column 552 can be analogous to the soft data associated with the program state (e.g., 444-1) of the second of the two memory cells previously described in connection with FIG. 4.

Column 554 of chart 550 includes a number of possible combinations of the soft data of column 552 (e.g., the soft data associated with the program states of the two memory cells). The soft data combinations of column 554 correspond to the soft data associated with the data state (e.g., 110) that corresponds to the combination of the program states of the two memory cells. That is, column 554 includes the soft data associated with the data state that corresponds to the combination of the program states of the two memory cells, which can be determined by combining the soft data associated the program state of the first memory cell and the soft data associated with the program state of the second memory cell from column 552.

As an example, if the soft data associated with the program states of both the first and second memory cells is 00 (e.g., the situation represented by point 448-1 in FIG. 4), this combination corresponds to soft data combination 000 of column 554, as shown in FIG. 5. That is, if the soft data associated with the program states of both the first and second memory cells is 00, the soft data associated with the data state that corresponds to the combination of the program states of the two memory cells is 000. As an additional example, if the soft data associated with the program state of the first memory cell is 11 and the soft data associated with the program state of the second memory cell is 00 (e.g., the situation represented by point 448-2 in FIG. 4), this combination corresponds to soft data combination 100 of column 554, as shown in FIG. 5. That is, if the soft data associated with the program state of the first memory cell is 11 and the soft data associated with the program state of the second memory cell is 00, the soft data associated with the data state that corresponds to the combination of the program states of the two memory cells is 100. As an additional example, if the soft data associated with the program states of both the first and second memory cells is 11 (e.g., the situation represented by point 448-3 in FIG. 4), this combination corresponds to soft data combination 110 of column 554, as shown in FIG. 5. That is, if the soft data associated with the program states of both the first and second memory cells is 11, the soft data associated with the data state that corresponds to the combination of the program states of the two memory cells is 110.

In some instances, a soft data combination of column 554 may correspond to a single (e.g., only one) combination of the soft data of column 552 (e.g., the soft data combination of column 554 may not correspond to any additional combinations of the soft data of column 552). For example, soft data combination 000 may only correspond to the combination in which the soft data associated with the program states of both the first and second memory cells is 00. That is, the soft data associated with the data state that corresponds to the combination of the program states of the two memory cells may be 000 only if the soft data associated with the program states of both the first and second memory cells is 00.

In some instances, a soft data combination of column 554 may correspond to multiple (e.g., more than one) combinations of the soft data of column 552. For example, in addition to soft data combination 100 corresponding to the combination in which the soft data associated with the program state of the first memory cell is 11 and the soft data associated with the program state of the second memory cell is 00, soft data combination 100 may also correspond to additional combinations of the soft data associated with the program states of the two memory cells. That is, the soft data associated with the data state that corresponds to the combination of the program states of the two memory cells may be 100 for multiple combinations of the soft data of column 552 (e.g., combinations in addition to the combination in which the soft data associated with the program state of the first memory cell is 11 and the soft data associated with the program state of the second memory cell is 00).

In the example illustrated in FIG. 5, column 554 includes six possible combinations of the soft data of column 552. However, embodiments of the present disclosure are not limited to a particular number of soft data combinations. For example, column 554 could include up to 16 possible combinations of the soft data of column 552.

The soft data combinations of column 554 can indicate the location of the Vts associated with the two memory cells within the Vt distributions associated with the program states of the two memory cells, and/or the probability of whether the Vts associated with the two memory cells correspond to the program states of the two memory cells. For example, 000 can indicate a high probability that the Vts associated with the two memory cells correspond to the program states of the two memory cells, 001 and 011 can indicate a medium probability that the Vts associated with the two memory cells correspond to the program states of the two memory cells, 100 and 101 can indicate a low probability that the Vts associated with the two memory cells correspond to the program states of the two memory cells, and 110 can indicate a very low probability that the Vts associated with the two memory cells correspond to the program states of the two memory cells.

Figure 6:
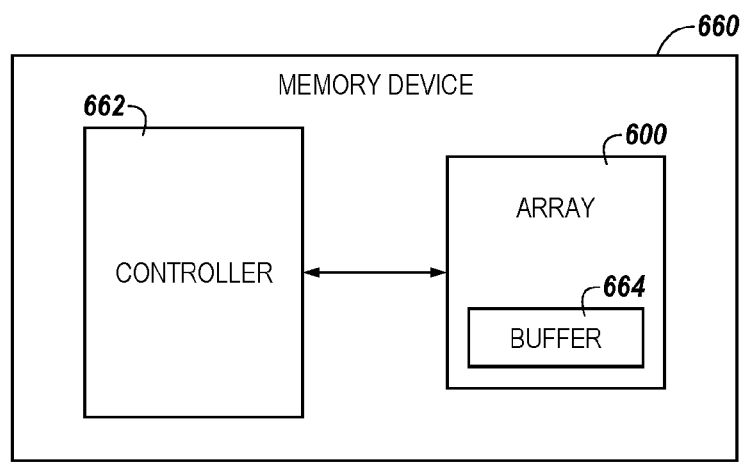
FIG. 6 illustrates a block diagram of an apparatus in the form of a memory device in accordance with a number of embodiments of the present disclosure.

FIG. 6 illustrates a block diagram of an apparatus in the form of a memory device 660 in accordance with a number of embodiments of the present disclosure. As shown in FIG. 6, memory device 660 includes a controller 662 coupled to a memory array 600. Memory array 600 can include a buffer 664. Buffer 664 can be, for example, a page buffer.

Memory array 600 can be, for example, memory array 100 previously described in connection with FIG. 1. Although one memory array is shown in FIG. 6, embodiments of the present disclosure are not so limited (e.g., memory device 660 can include more than one memory array coupled to controller 662).

Controller 662 can include, for example, control circuitry and/or firmware. As an example, controller 662 can be a fractional bit controller. Controller 662 can be included on the same physical device (e.g., the same die) as memory array 600, or can be included on a separate physical device that is communicatively coupled to the physical device that includes memory array 600.

Controller 662 and/or buffer 664 can determine soft data associated with the memory cells in memory array 600 in accordance with a number of embodiments of the present disclosure. For example, controller 662 and/or buffer 664 can determine soft data associated with the program states of at least two of the memory cells in memory array 600, and determine soft data associated with the data state that corresponds to the combination of the program states of the at least two memory cells based, at least in part, on the soft data associated with the program states of the at least two memory cells.

The embodiment illustrated in FIG. 6 can include additional circuitry that is not illustrated so as not to obscure embodiments of the present disclosure. For example, memory device 660 can include address circuitry to latch address signals provided over I/O connectors through I/O circuitry. Address signals can be received and decoded by a row decoder and a column decoder, to access memory array 600. As an additional example, memory device 660 can include sense (e.g., read) circuitry.

CONCLUSION

The present disclosure includes apparatuses and methods for determining soft data for combinations of memory cells. A number of embodiments include an array of memory cells, wherein the array includes a first memory cell and a second memory cell, wherein the first and second memory cells are each programmable to one of a number of program states, and wherein a combination of the program states of the first and second memory cells corresponds to one of a number of data states. A number of embodiments also include a buffer and/or a controller coupled to the array and configured to determine soft data associated with the program states of the first and second memory cells and determine soft data associated with the data state that corresponds to the combination of the program states of the first and second memory cells based, at least in part, on the soft data associated with the program state of the first memory cell and the soft data associated with the program state of the second memory cell.

Although specific embodiments have been illustrated and described herein, those of ordinary skill in the art will appreciate that an arrangement calculated to achieve the same results can be substituted for the specific embodiments shown. This disclosure is intended to cover adaptations or variations of a number of embodiments of the present disclosure. It is to be understood that the above description has been made in an illustrative fashion, and not a restrictive one. Combination of the above embodiments, and other embodiments not specifically described herein will be apparent to those of ordinary skill in the art upon reviewing the above description. The scope of a number of embodiments of the present disclosure includes other applications in which the above structures and methods are used. Therefore, the scope of a number of embodiments of the present disclosure should be determined with reference to the appended claims, along with the full range of equivalents to which such claims are entitled.

In the foregoing Detailed Description, some features are grouped together in a single embodiment for the purpose of streamlining the disclosure. This method of disclosure is not to be interpreted as reflecting an intention that the disclosed embodiments of the present disclosure have to use more features than are expressly recited in each claim. Rather, as the following claims reflect, inventive subject matter lies in less than all features of a single disclosed embodiment. Thus, the following claims are hereby incorporated into the Detailed Description, with each claim standing on its own as a separate embodiment.

What is claimed is:

1. An apparatus, comprising:
    an array of memory cells having a number of data states associated therewith; and
    at least one of a controller and a buffer configured to determine soft data associated with one of the number of data states based, at least in part, on soft data associated with a program state of a first one of the memory cells and soft data associated with a program state of a second one of the memory cells.

2. The apparatus of claim 1, wherein the at least one of the controller and the buffer is configured to determine the soft data associated with the one of the number of data states by combining the soft data associated with the program state of the first memory cell and the soft data associated with the program state of the second memory cell.

3. The apparatus of claim 1, wherein the number of data states correspond to combinations of program states of the memory cells of the array.

4. The apparatus of claim 1, wherein the memory cells of the array are fractional bit memory cells.

5. The apparatus of claim 1, wherein the at least one of the controller and the buffer is configured to determine the soft data associated with one of the number of data states based, at least in part, on soft data associated with a program state of a third one of the memory cells.

6. The apparatus of claim 1, wherein the first one of the memory cells and the second one of the memory cells are in different pages of memory cells in the array.

7. The apparatus of claim 1, wherein each of the number of data states include three bits of data.

8. A method of operating memory, comprising:
    combining soft data associated with a program state of a first memory cell and soft data associated with a program state of a second memory cell; and
    determining soft data associated with a data state that corresponds to the first memory cell and the second memory cell based, at least in part, on the combination of the soft data associated with the program state of the first memory cell and the soft data associated with the program state of the second memory cell.

9. The method of claim 8, wherein the data state corresponds to a combination of the program state of the first memory cell and the program state of the second memory cell.

10. The method of claim 8, wherein the method includes:
   determining the soft data associated with the program state of the first memory cell; and
   determining the soft data associated with the program state of the second memory cell.

11. The method of claim 8, wherein the method includes:
   combining the soft data associated with the program state of the first memory cell and the soft data associated with the program state of the second memory cell using a controller; and
   determining the soft data associated with the data state that corresponds to the first memory cell and the second memory cell using the controller.

12. The method of claim 8, wherein the method includes:
   combining the soft data associated with the program state of the first memory cell and the soft data associated with the program state of the second memory cell using a buffer; and
   determining the soft data associated with the data state that corresponds to the first memory cell and the second memory cell using the buffer.

13. The method of claim 8, wherein:
   the soft data associated with the program state of the first memory cell and the soft data associated with the program state of the second memory cell each include two bits of data; and
   the combination of the soft data associated with the program state of the first memory cell and the soft data associated with the program state of the second memory cell includes three bits of data.

14. An apparatus, comprising:
   an array of memory cells, wherein the array includes a first memory cell and a second memory cell, wherein the first and second memory cells are each programmable to one of a number of program states; and
   at least one of a controller and a buffer configured to:
      combine soft data associated with the program state of the first memory cell and soft data associated with the program state of the second memory cell; and
      determine soft data associated with a data state that corresponds to the first memory cell and the second memory cell based, at least in part, on the combination of the soft data associated with the program state of the first memory cell and the soft data associated with the program state of the second memory cell.

15. The apparatus of claim 14, wherein the combination of the soft data associated with the program state of the first memory cell and the soft data associated with the program state of the second memory cell is one of a plurality of soft data combinations.

16. The apparatus of claim 15, wherein the plurality of soft data combinations includes six soft data combinations.

17. The apparatus of claim 15, wherein at least one of the plurality of soft data combinations corresponds to a single combination of the soft data associated with the program state of the first memory cell and the soft data associated with the second memory cell.

18. The apparatus of claim 15, wherein at least one of the plurality of soft data combinations corresponds to multiple combinations of the soft data associated with the program state of the first memory cell and the soft data associated with the second memory cell.

19. The apparatus of claim 14, wherein the determined soft data associated with the data state that corresponds to the first memory cell and the second memory cell indicates a quality of the data state.

20. The apparatus of claim 14, wherein the determined soft data associated with the data state that corresponds to the first memory cell and the second memory cell indicates a confidence level of the data state.

* * * * *